United States Patent [19]

Kim

[11] Patent Number: 5,151,668
[45] Date of Patent: Sep. 29, 1992

[54] FM MODULATOR FOR COMPENSATING MODULATION CHARACTERISTICS ON EACH CHANNEL

[75] Inventor: Jong-Hae Kim, Suwon, Rep. of Korea

[73] Assignee: Samsung electronics Co., Ltd., Suwon, Rep. of Korea

[21] Appl. No.: 788,290

[22] Filed: Nov. 5, 1991

[30] Foreign Application Priority Data

May 23, 1991 [KR] Rep. of Korea ............... 1991-8356

[51] Int. Cl.$^5$ ............................................. H03C 3/08
[52] U.S. Cl. ................................... 332/124; 332/136; 455/42; 455/110
[58] Field of Search ................ 332/123, 124, 136; 455/43, 42, 110, 113, 119

[56] References Cited

U.S. PATENT DOCUMENTS 4,117,422 9/1978 Hunt .................................. 332/124
5,075,644 12/1991 Calvin ........................... 332/123 X Primary Examiner—Siegfried H. Grimm
Attorney, Agent, or Firm—Robert E. Bushnell

[57] ABSTRACT

A frequency-modulation modulator in a cellular wireless telephone for modulating frequency after uniformly and linearly compensating for frequency characteristics to be suitable for each engaged channel in a cellular wireless telephone. Since frequency modulation characteristics are compensated uniformly and linearly according to each one of a plurality of channels, an error due to the frequency distorted modulation can be prevented and the cellular wireless telephone becomes more reliable. The frequency-modulation modulator includes a controller for providing data to assign the channel by sensing a transmitting/receiving channel, and for generating a switch control signal corresponding to each channel, and of a frequency compensator for compensating for frequency characteristics according to each channel by regulating a gain of an input channel by means of the switch control signal from the controller, and of a capacitance converter for converting a given voltage value from the frequency compensator into a capacitance value, and of a resonator for generating a given resonance frequency with the capacitance value of the capacitance converter, and of a voltage controlled oscillator for generating an oscillation frequency to modulate the corresponding frequency based on the resonance frequency.

4 Claims, 2 Drawing Sheets

/ 1

FM MODULATOR FOR COMPENSATING MODULATION CHARACTERISTICS ON EACH CHANNEL

BACKGROUND OF THE INVENTION

This invention relates to a frequency-modulation(FM) modulator in a cellular wireless telephone, more particularly to an FM modulator which modulates corresponding frequencies after linearly compensating for modulation characteristics on a respective one of a plurality of channels.

In general, frequency characteristics in modulation of a cellular wireless telephone are not shown linearly over all frequency channels because the cellular wireless telephone employs a large number of, for example, hundreds or thousands of frequency channels.

FIG. 1 shows a schematic construction of one of known FM modulators. The FM modulator has a varactor diode 1 for frequency deviation of an input signal from an input channel, a resonator 3 for resonating the deviated frequency from the varactor diode 1 to provide therefrom a resonance frequency, and a voltage controlled oscillator 4 for generating an oscillation frequency depending on the resonance frequency provided from the resonator 3.

FIG. 2 shows a voltage-to-capacitance characteristic diagram of the varactor diode 1, and FIG. 3 shows a waveform of input channel signal in a voltage-to-time representation.

A capacitance of the varactor diode 1 varies as an input voltage (shown in FIG. 2). Therefore, if a signal shown in FIG. 3 is input through an input node P1, respective input voltages according to time, for example +Va, +Vb, −Vc, and −Vd, are supplied to the varactor diode 1, so that the capacitance of the varactor diode 1 varies to Ca, Cb, Cc, and Cd, respectively. The varied value of the capacitance varies the resonance frequency of the resonator 3 composed of the coil L1 and the capacitor C1. The resonance frequency $f_o$ of the resonator 3 is determined by the following equation.

$$f_o = \frac{1}{2\pi^2 \sqrt{LC}}$$

wherein, $f_o$ is resonance frequency, L is inductance, and C is capacitance.

The resonance frequency $f_o$ of the resonator 3 provides an oscillation frequency to the voltage controlled oscillator 4. The conventional FM modulator of FIG. 1, as described above, has uniform frequency modulation characteristics due to the linear properties of the varactor diode in a small number of channels with a narrow frequency band, but has a problem that inconsistent frequency modulation characteristics due to the unlinear properties of the varactor diode in the multichannel with wide frequency band causes an error.

SUMMARY OF THE INVENTION

Accordingly, the object of the present invention is to provide an FM modulator for a cellular wireless telephone, wherein the FM modulator can modulate frequency after uniformly and linearly compensating for frequency modulation characteristics to be suitable for each one of a plurality of channels.

Another object of the present invention is to provide a FM modulator for modulating frequency after varying a resonance frequency by regulating an amplification gain of an operational amplifier suitable for each corresponding channel.

In order to achieve the above objects and other advantages of the invention, an FM modulator according to the present invention includes a controller for outputting data for assigning a channel after sensing a transmitting/receiving channel and for generating a switch control signal based upon each one of a plurality of channels, a frequency characteristic compensation part for compensating frequency characteristics according to each channel by regulating a gain with the switch control signal of the controller after receiving an input channel frequency through an input node, a capacitance conversion part for converting each voltage of frequency, compensated in the frequency characteristic compensation part, into capacitance, a resonator for deciding a resonance frequency by resonating with the capacitance value converted from the capacitance conversion part, and a voltage controlled oscillator for generating an oscillation frequency after modulating frequency with the resonance frequency output from the resonator.

BRIEF DESCRIPTION OF THE DRAWINGS

For a better understanding of the invention and to show how the same may be carried into effect, reference will be made, by way of example, to the accompanying diagrammatic drawings, in which.

DETAILED DESCRIPTION OF THE PREFERRED EMBODIMENTS

Figure 1:
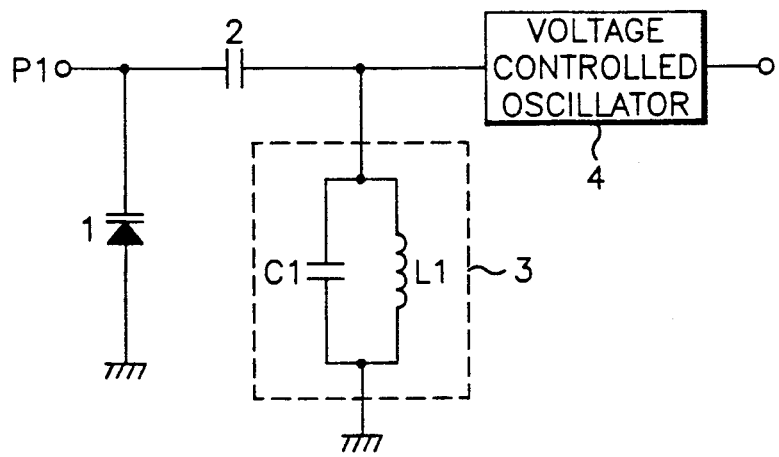
FIG. 1 shows a schematic diagram of one of known FM modulators.
Figure 2:
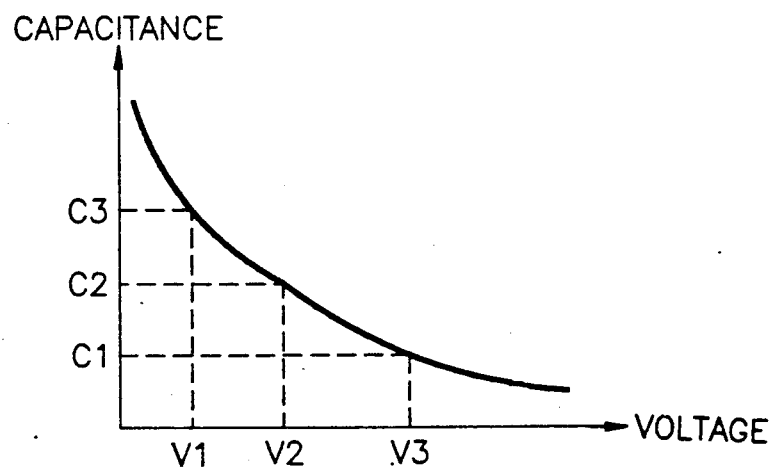
FIG. 2 shows a voltage-to-capacitance characteristic diagram in a varactor diode.
Figure 3:
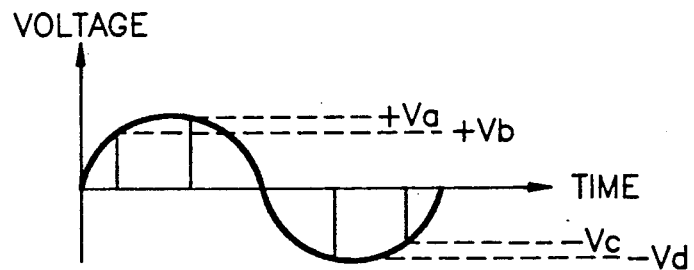
FIG. 3 shows a waveform of an input channel signal in voltage-to-time representation.
Figure 4:
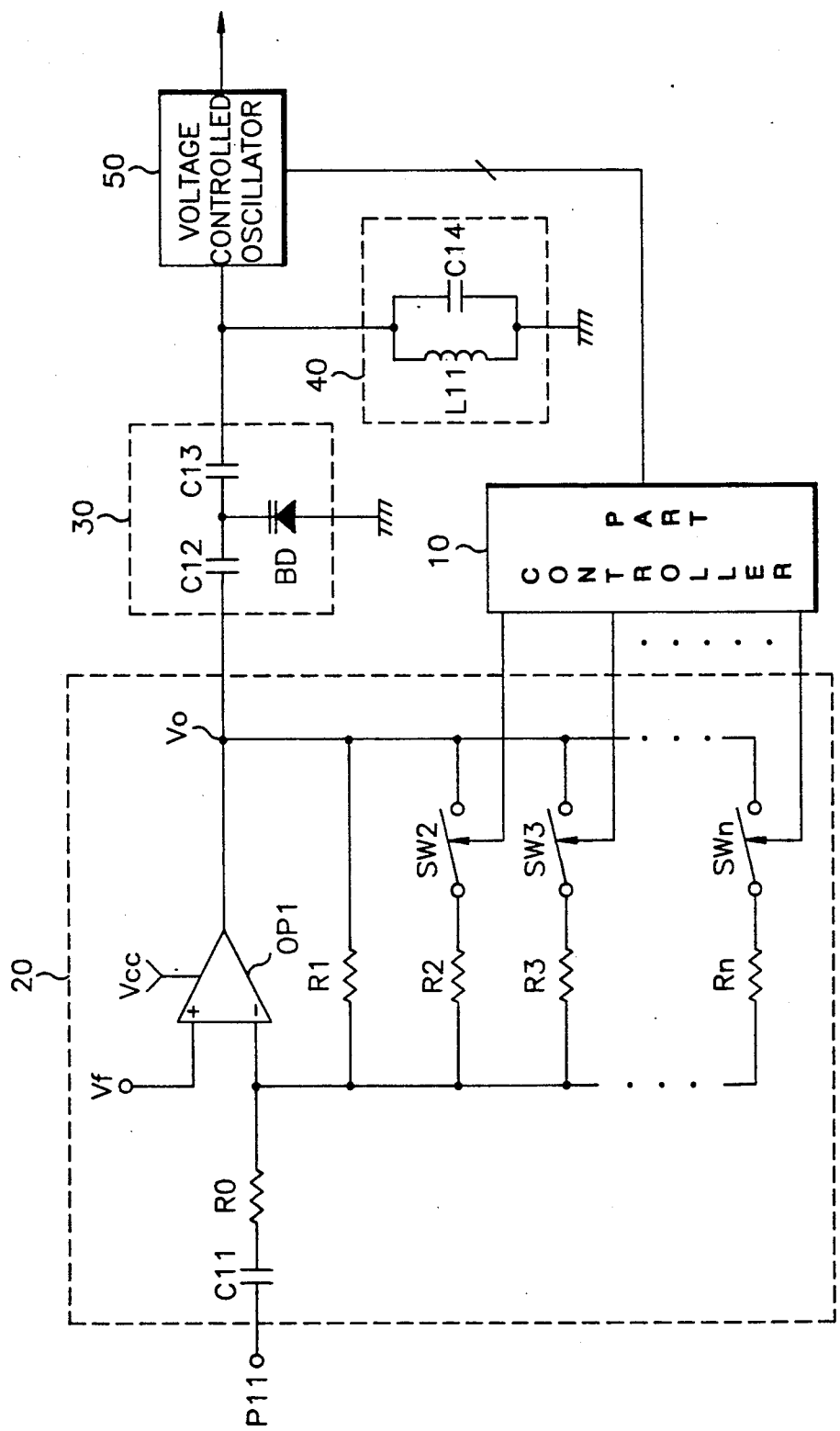
FIG. 4 shows a schematic diagram of an FM modulator according to the present invention.

Referring to FIG. 4, an FM modulator in accordance with the present invention includes a controller 10 for outputting data for assigning a channel after sensing a transmitting/receiving channel and for generating a switch control signal based upon each one of a plurality of channels, a frequency characteristic compensation part 20 for compensating for frequency characteristics to be suitable for each channel by regulating a frequency gain with the switch control signal of the controller 10 after receiving the input channel frequency through an input node P11, a capacitance conversion part 30 for converting each voltage of frequency, compensated in the frequency characteristic compensation part 20, into capacitance, a resonator 40 for generating a resonance frequency by resonating with a capacitance value output from the capacitance conversion part 30, and a voltage controlled oscillator 50 for generating an oscillation frequency after modulating frequency with the resonance frequency output from the resonator 40.

In the frequency characteristic compensation part 20, a resistor R0 connected to a capacitance C11 in series is coupled with an inverting node (−) of an operational amplifier OP1 whose noninverting node (+) is supplied to a reference voltage Vf according to the channel. A resistor R1 is positioned in parallel between the inverting node (−) and an output node of the operational amplifier OP1, and a plurality of resistors R2–Rn are connected in series to a plurality of switches SW2-SWn, respectively and said resistors and switches are connected in parallel to resistor R1. In the capacitance conversion part 30, capacitors C12, C13 are connected to each other in series, and a varactor diode BD is connected between a coupling node of the capacitors C12, C13 and a grounding.

Operations of FIG. 4 will be described hereinafter in detail. If a signal with a frequency of a given channel is input through the input node P11, direct current component of the input signal is removed by the capacitor C11 whose output is applied to the inverting node of the operational amplifier OP1 through the resistor R0. In the meantime, if the switch control signal according to the channel sensed by the controller 10 activates selectively the switches SW2-SWn, the gain of the operational amplifier OP1 is changed accordingly. First, in case that, for example, the switches SW2-SWn are all open, the gain is $$G1 = 20\log\left(\frac{1}{R_o} \times R1\right)dB$$

Second, in case that only the switch SW2 is closed while others open, the gain is $$G2 = 20\log\left(\frac{1}{R_o} \times \frac{R1 \cdot R2}{R1 + R2}\right)$$

Third, in case that the switches SW2 and SW3 are closed, the gain is $$G2 = 20\log\left(\frac{1}{R_o} \times \frac{R1 \cdot R2 \cdot R3}{R1 + R2 + R3}\right)dB$$

Finally, in case that the switches SW2-SWn are all closed, the gain is $$Gn = 20\log\left(\frac{1}{R_o} \times \frac{R1 \cdot R2 \ldots Rn}{R1 + R2 + \ldots + Rn}\right)dB$$

Thus, the channel frequency compensated by the operational amplifier OP1 is coupled to the varactor diode BD through the capacitor C12, and respective time-varying voltages of the compensated channel frequency are converted into capacitance components by the varactor diode BD. The capacitance value converted by the varactor diode BD varies the resonance frequency of the resonator 40 consisting of a coil L11 and a capacitor C14. The resonance frequency $f_o$ of the resonator 40 is determined by the following equation.

$$f_o = \frac{1}{2\pi^2\sqrt{LC}}$$

With the resonance frequency determined in the resonator 40, the voltage controlled oscillator 50 generates a given oscillation frequency and then modulates the frequency, so that the frequency modulation characteristics of each channel may be compensated uniformly.

As described above, according to the present invention, since the frequency modulation characteristics are compensated uniformly and linearly according to each engaged channel in a cellular wireless telephone, an error due to the frequency distorted modulation characteristics is prevented, and the cellular wireless telephone becomes more reliable While the invention has been particularly shown and described with reference to the preferred embodiment, it will be understood by those skilled in the art that modifications in detail may be made without departing from the spirit and scope of the invention.

What is claimed is:

1. A frequency-modulation modulator for compensating for modulation characteristics to be suitable for each engaged channel in a cellular wireless telephone, said frequency-modulation modulator comprising:

control means for providing data to assign the channel by sensing a transmitting/receiving channel, and for generating switch control signals corresponding to said channels;

frequency compensation means for compensating for frequency characteristics of said respective channels by regulating gain of an input channel in response to said switch control signal from said control means;

a capacitance conversion means for converting into capacitance value a given voltage value from said frequency compensation means;

a resonator for generating a given resonance frequency according to said capacitance value of said capacitance conversion means; and a voltage controlled oscillator for generating an oscillation frequency, to thereby perform the frequency modulation according to said resonance frequency.

2. A frequency-modulation modulator according to claim 1, wherein said frequency compensation means comprises:

a capacitor;

a first resistor coupled with said capacitor in series;

an operational amplifier of which inverting node is coupled with said first resistor and of which noninverting node is provided with a reference voltage according to said channel;

a second resistor positioned between said inverting node and an output node of said operational amplifier;

a plurality of gain control resistors coupled in parallel with said second resistor; and a plurality of switches each coupled in series between said respective gain control resistors and the output node of said operational amplifier, the series connection of resistor-switch being connected in parallel to said second resistor.

3. A frequency-modulation modulator according to claim 2, wherein said gain control resistor is coupled to the output of said operational amplifier in response to each switch control signal depending on said each channel.

4. A frequency-modulation modulator according to claim 2, wherein said switches are turned on/off in order to decide gain corresponding to said channel, in response to respective switch control signals.

* * * * *